United States Patent
Murakami et al.

(10) Patent No.: US 10,812,062 B2
(45) Date of Patent: Oct. 20, 2020

(54) DRIVING DEVICE FOR SEMICONDUCTOR ELEMENT

(71) Applicant: Mitsubishi Electric Corporation, Tokyo (JP)

(72) Inventors: Haruhiko Murakami, Tokyo (JP); Ryo Goto, Tokyo (JP); Shiori Uota, Tokyo (JP); Koichiro Noguchi, Tokyo (JP); Motoki Imanishi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/252,131

(22) Filed: Jan. 18, 2019

(65) Prior Publication Data

US 2019/0326897 A1    Oct. 24, 2019

(30) Foreign Application Priority Data

Apr. 23, 2018   (JP) .................. 2018-082016

(51) Int. Cl.
| | |
|---|---|
| *H03K 17/082* | (2006.01) |
| *H03K 17/18* | (2006.01) |
| *G08B 21/18* | (2006.01) |
| *H02H 9/02* | (2006.01) |
| *H03K 17/08* | (2006.01) |

(52) U.S. Cl.
CPC ....... *H03K 17/0822* (2013.01); *G08B 21/185* (2013.01); *H02H 9/02* (2013.01); *H03K 17/18* (2013.01); *H03K 2017/0806* (2013.01); *H03K 2217/0027* (2013.01)

(58) Field of Classification Search
CPC .. H03K 17/082; H03K 17/0822; H03K 17/18; H03K 2017/0806; H03K 2217/0027; H03K 17/107; H03K 17/127; H03K 3/011; H03K 17/08116; H03K 17/567; H02M 1/08; H02M 2001/327; H02M 1/32; H02H 9/02; H02H 7/122; G08B 21/185; G01R 19/16504; G01K 7/01

See application file for complete search history.

(56) References Cited

U.S. PATENT DOCUMENTS

| | | | |
|---|---|---|---|
| 2012/0146782 A1* | 6/2012 | Komatsu | H03K 17/0822 340/501 |
| 2017/0134018 A1* | 5/2017 | Imanishi | H02M 1/32 |
| 2018/0367023 A1* | 12/2018 | Terashima | H03K 17/0822 |

FOREIGN PATENT DOCUMENTS

| | | |
|---|---|---|
| JP | 2012-143125 A | 7/2012 |
| JP | 2013-258858 A | 12/2013 |

\* cited by examiner

*Primary Examiner* — Brian Wilson
(74) *Attorney, Agent, or Firm* — Studebaker & Brackett PC (57) ABSTRACT

A driving device for a semiconductor element includes: a plurality of detection circuits that detect different types of abnormalities of the semiconductor element; a logic circuit that generates an error signal when at least one of the detection circuits detects an abnormality; an alarm signal generating circuit that receives the error signal and generates an alarm signal made of one or a plurality of pulses, the alarm signal having a different pulse width for each of the detection circuits that has detected an abnormality; and a protection operation determining circuit that determines whether or not a protection function of the semiconductor element is operating based on the error signal and the alarm signal, and shuts off input of a drive signal to the semiconductor element when it is determined that the protection function is operating.

12 Claims, 13 Drawing Sheets

DRIVING DEVICE FOR SEMICONDUCTOR ELEMENT

BACKGROUND OF THE INVENTION

Field of the Invention

The present invention relates to a driving device for a semiconductor element.

Description of the Background Art

Recently, an intelligent power module (IPM) has attracted attention. The intelligent power module results from modularizing, as one electronic component, a plurality of semiconductor elements made of power transistors such as, for example, insulated gate bipolar transistors (IGBT), and driving circuits thereof, and further, a protection circuit against abnormalities such as an overcurrent, lowering of a control power supply voltage, and overheating of the semiconductor elements.

Japanese Patent Application Laid-Open No. 2012-143125 discloses a driving device including a plurality of protection circuits that detect an abnormality of a semiconductor element, and a signal output circuit that outputs an alarm signal of a pulse width preset in accordance with a type of the abnormality detected by each of the protection circuits by only one pulse or in a unit of one pulse at preset time intervals.

However, the driving device of Japanese Patent Application Laid-Open No. 2012-143125 has a problem that it cannot be detected that the abnormality of the semiconductor element has been resolved.

In this regard, Japanese Patent Application Laid-Open No. 2013-258858 proposes a driving device for a semiconductor element having a function of accurately notifying an alarm signal of a pulse width in accordance with a type of an abnormality occurring in the semiconductor element, and having a function of notifying that an abnormality factor of the semiconductor element has been eliminated.

SUMMARY

However, in the technique of Japanese Patent Application Laid-Open No. 2013-258858, apart from an alarm signal generating circuit that generates the alarm signal of the pulse width in accordance with the type of the abnormality, an alarm cancellation signal generating circuit that generates a signal for notifying that the abnormality factor has been eliminated is required, and there is a problem that a size of the driving device is increased. Also, with the technique of Japanese Patent Application Laid-Open No. 2013-258858, since an alarm cancellation signal is outputted after the abnormality factor has been eliminated, there is a problem that it takes time to recover. Furthermore, in the technique of Japanese Patent Application Laid-Open No. 2013-258858, it is necessary to measure the pulse width in order to discriminate the abnormality factor and to measure the alarm cancellation signal in order to detect that the abnormality factor has been eliminated, which is not practical.

An object of the present invention is to suppress an increase in size and promptly resume input of a drive signal to a semiconductor element when an abnormality of the semiconductor element is eliminated in a driving device for a semiconductor element.

A driving device for a semiconductor element according to the present invention includes a plurality of detection circuits, a logic circuit, an alarm signal generating circuit, and a protection operation determining circuit. The plurality of detection circuits detect different types of abnormalities of the semiconductor element. The logic circuit generates an error signal when at least one of the detection circuits detects an abnormality. Upon receiving the error signal, the alarm signal generating circuit generates an alarm signal made of one or a plurality of pulses, the alarm signal having a different pulse width for each of the detection circuits that has detected an abnormality. A protection operation determining circuit determines whether or not a protection function of the semiconductor element is operating based on the error signal and the alarm signal, and shuts off input of a drive signal to the semiconductor element when it is determined that the protection function is operating.

According to the driving device for the semiconductor element of the present invention, the protection operation determining circuit can determine that the abnormality of the semiconductor element has been eliminated by the end of the alarm signal. Therefore, the driving device for the semiconductor element according to the present invention can promptly resume input of the drive signal to the semiconductor element after the abnormality of the semiconductor element has been eliminated. Further, since an alarm cancellation signal generating circuit is unnecessary, downsizing of the device is possible.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

Figure 1:
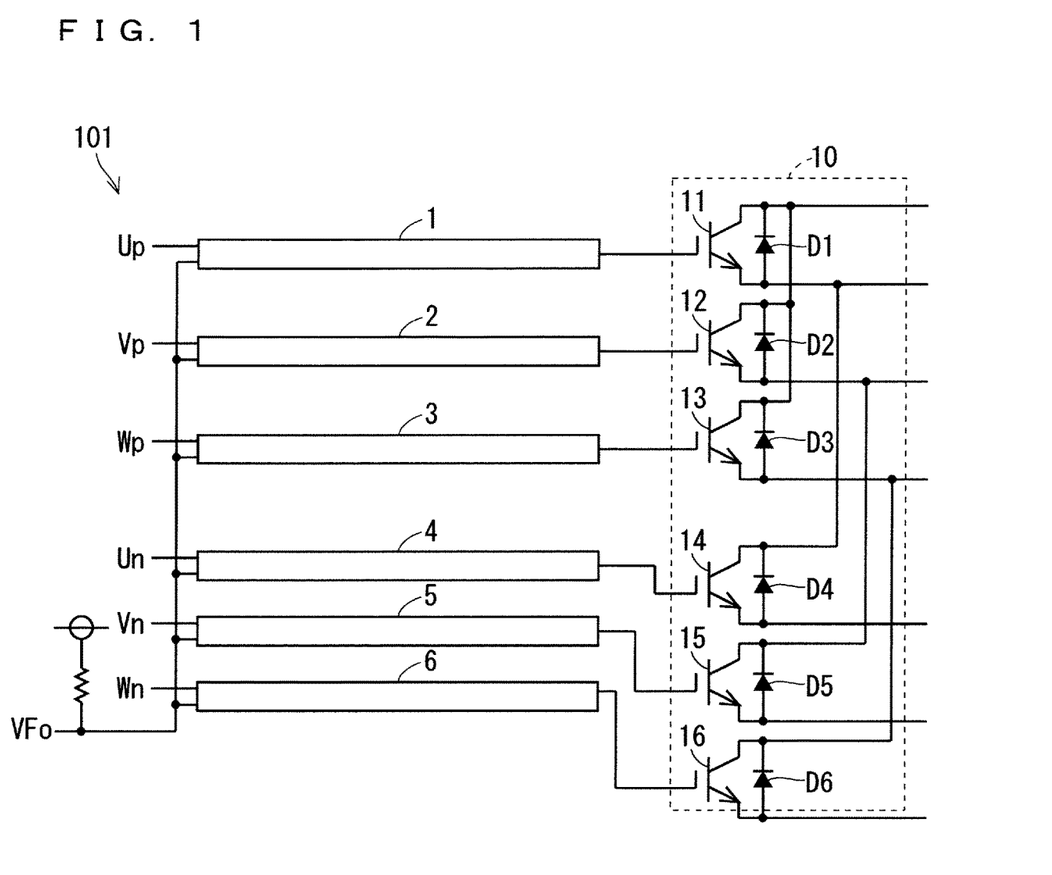
FIG. 1 is a diagram showing a schematic configuration of a main part of a semiconductor device according to a first preferred embodiment.

FIG. 1 is a diagram showing a schematic configuration of a main part of a semiconductor device 101 according to a first preferred embodiment. The semiconductor device 101 includes an inverter 10 and driving devices 1 to 6. The inverter 10 includes a plurality of IGBTs 11 to 16, and freewheeling diodes D1 to D6 connected in parallel to the IGBTs 11 to 16, respectively, and converts a DC power to an AC power. The IGBT 11 and the freewheeling diode D1 configure a U-phase upper arm, and the IGBT 14 and the freewheeling diode D4 configures a U-phase lower arm. The IGBT 12 and the freewheeling diode D2 configure a V-phase upper arm, and the IGBT 15 and the freewheeling diode D5 configure a V-phase lower arm. The IGBT 13 and the freewheeling diode D3 configure a W-phase upper arm, and the IGBT 16 and the freewheeling diode D6 configure a W-phase lower arm. The driving devices 1 to 6 individually drive the plurality of IGBTs 11 to 16 configuring the inverter 10. Note that the IGBTs are examples of semiconductor elements driven by the driving devices 1 to 6, and other semiconductor elements such as a metal-oxide-semiconductor field-effect transistor (MOSFET) and the like may be used in place of the IGBTs.

Figure 2:
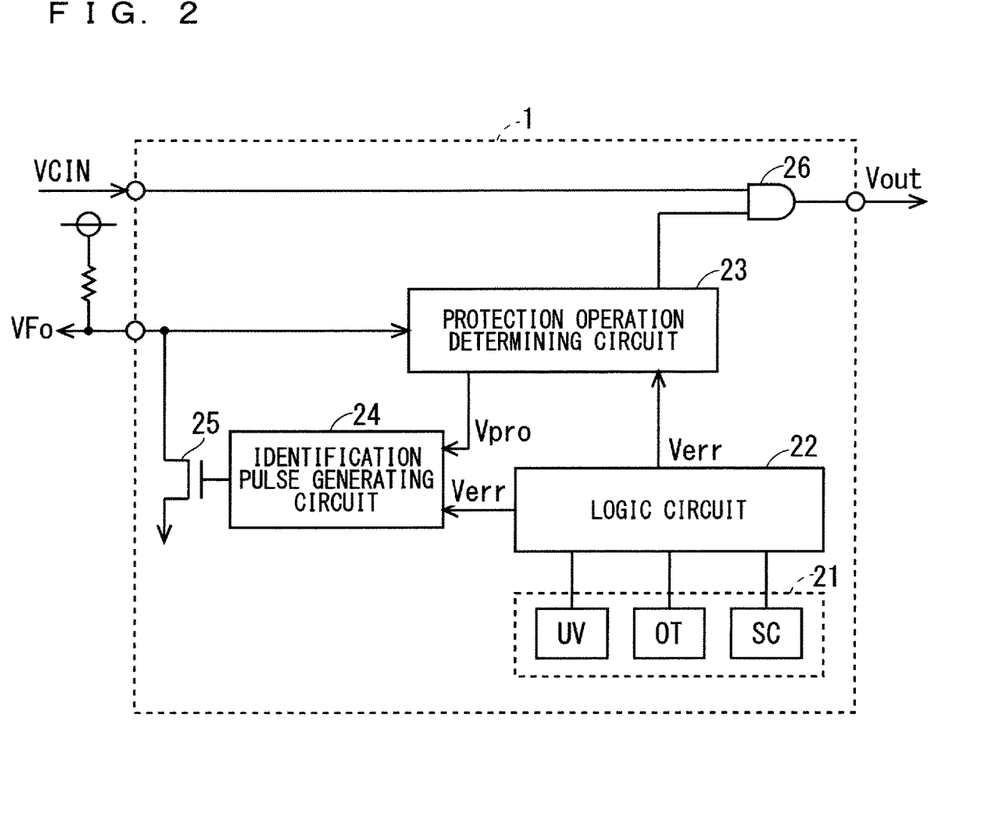
FIG. 2 is a block diagram showing a U-phase upper arm driving device.

FIG. 2 is a block diagram showing the U-phase upper arm driving device 1. Since configurations of the other driving devices 2 to 6 are similar to that of the driving device 1, description of these configurations will be omitted.

The driving device 1 includes detection circuits 21, a logic circuit 22, a protection operation determining circuit 23, an identification pulse generating circuit 24, a MOSFET 25, and an AND gate 26.

The detection circuits 21 are circuits that implement various protection functions of the semiconductor device 101, and include a control power supply voltage detecting circuit UV, a temperature detecting circuit OT, and a current detecting circuit SC.

The logic circuit 22 compares signals from the control power supply voltage detecting circuit UV, the temperature detecting circuit OT, and the current detecting circuit SC with predetermined voltages to determine whether or not the IGBT 11 is in an abnormal state. When determining that the IGBT 11 is in an abnormal state, the logic circuit 22 outputs an error signal Verr to the protection operation determining circuit 23 and the identification pulse generating circuit 24.

An alarm signal VFo and the error signal Verr are inputted to the protection operation determining circuit 23. From the alarm signal VFo and the error signal Verr, the protection operation determining circuit 23 determines whether or not a protection function of the IGBT 11 is operating. When determining that the protection function of the IGBT 11 is operating, the protection operation determining circuit 23 inputs a protection operation signal Vpro to the identification pulse generating circuit 24, and outputs an L level to the AND gate 26, which turns off a gate control signal Vout. As a result, the driving of the IGBT 11 is prohibited and it is protected from the abnormality.

The identification pulse generating circuit 24 has the error signal Verr inputted from the logic circuit 22, and the protection operation signal Vpro inputted from the protection operation determining circuit 23. The identification pulse generating circuit 24 generates an identification pulse, based on the error signal Verr and the protection operation signal Vpro. The identification pulse generated by the identification pulse generating circuit 24 is inputted to a gate of the MOSFET 25, whereby ON/OFF of an open-drain MOSFET 25 is controlled. A source of the MOSFET 25 outputs the alarm signal VFo to an outside of the protection operation determining circuit 23 and the driving device 1. That is, the identification pulse generating circuit 24 and the MOSFET 25 function as an alarm signal generating circuit that receives the error signal Verr and generates an alarm signal.

Figure 3:
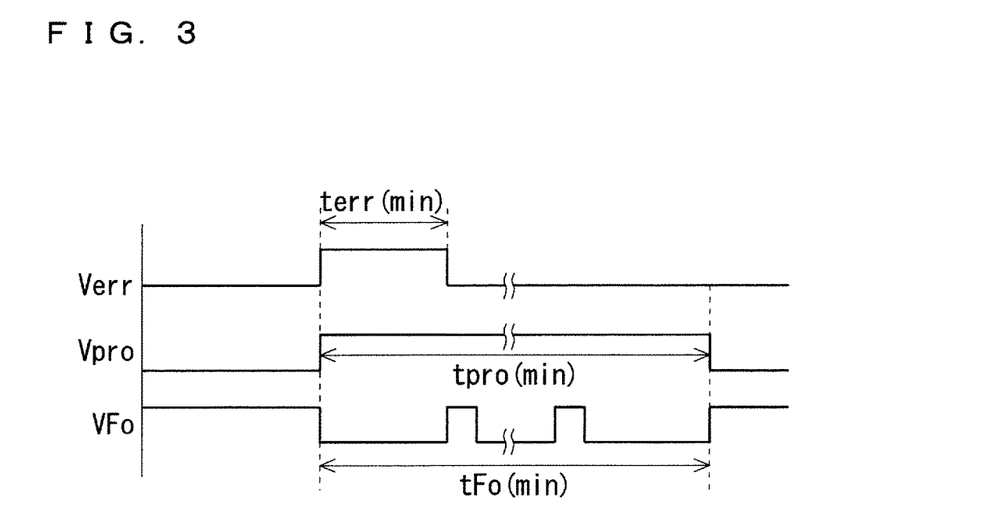
FIG. 3 is a diagram showing minimum pulse widths of an error signal, a protection operation signal and an alarm signal.

FIG. 3 shows minimum pulse widths of the error signal Verr, the protection operation signal Vpro, and the alarm signal VFo. Assuming that the minimum pulse widths of the error signal Verr, the protection operation signal Vpro, and the alarm signal VFo are a minimum error period terr (min), a minimum protection operation period tpro (min), and a minimum alarm signal output period tFo (min), respectively, a relation of these is terr (min)<tFo (min)=tpro (min). The minimum error period terr (min) is a minimum error length detectable by the detection circuits 21, and is decided by a filter time of a filter provided for each of the detection circuits 21. The filter time is generally set to a range of several ns to several μs. Specifically, the filter time of the current detecting circuit SC is set to about 2 μs. The minimum alarm signal output period tFo (min) is set to a length recognizable by a microcomputer that receives the alarm signal VFo, and is generally set to be several ms or more. In the first preferred embodiment, the minimum protection operation period tpro (min), and the minimum alarm signal output period tFo (min) are constant regardless of a type of the error, that is, regardless of the detection circuit 21 that has detected the abnormality.

Figure 4:
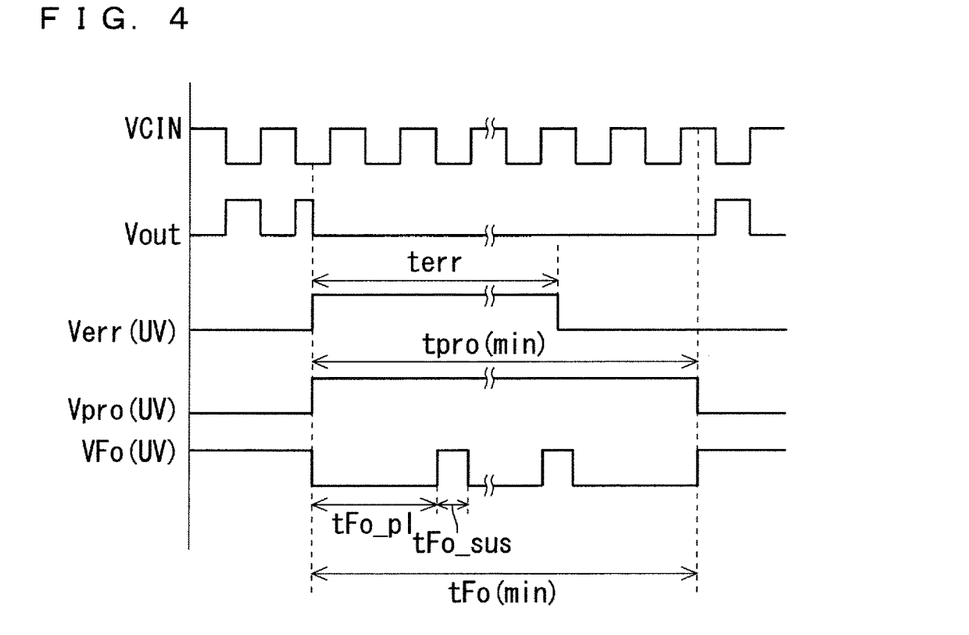
FIG. 4 is a diagram showing the alarm signal according to the first preferred embodiment in the case of terr≤tpro (min)

FIG. 4 shows the alarm signal VFo of the first preferred embodiment in the case of terr≤tpro (min). When the error signal Verr is off, since the protection operation determining circuit 23 outputs an H level to the AND gate 26, the gate control signal Vout is outputted in synchronization with a control signal VCIN. When one of the detection circuits 21 detects an abnormality, the logic circuit 22 turns on the error signal Verr, that is, sets it to the H level. The protection operation determining circuit 23 turns on the protective operation signal Vpro, that is, sets the protection operation signal Vpro to the H level, as the error signal Verr is turned on. Moreover, the identification pulse generating circuit 24 also generates the identification pulse as the error signal Verr is turned on. Therefore, the error signal Verr, the protection operation signal Vpro, and the alarm signal VFo are simultaneously turned on. Here, regarding the alarm signal VFo, the H level denotes OFF and the L level denotes ON.

During the period when the error signal Verr is ON, the protection operation determining circuit 23 outputs the L level to the AND gate 26, so that the gate control signal Vout becomes the L level and is shut off.

Since the minimum alarm signal output period tFo (min) is equal to the minimum protection operation period tpro (min), it is possible to identify the minimum protection operation period tpro (min) by monitoring tFo (min) outside the driving device 1.

While the alarm signal VFo is ON, the MOSFET 25 outputs a continuous pulse train having a different pulse width tFo_pl in each of the detection circuits as the alarm signal VFo. The identification pulse generating circuit 24 sets the pulse width tFo_pl of the alarm signal VFo, a suspension width tFo_sus of the alarm signal, and the minimum alarm signal output period tFo (min) such that Expression (1) is satisfied. Here, "n" is a natural number, which is a different value for each of the detection circuits.

[Expression 1]

$$n \times tFo\_pl + (n-1) \times tFo\_sus = tFo(\min) \quad (1)$$

In the case of terr≤tpro (min), the minimum alarm signal output period tFo (min) is constant regardless of the type of the abnormality.

Figure 5:
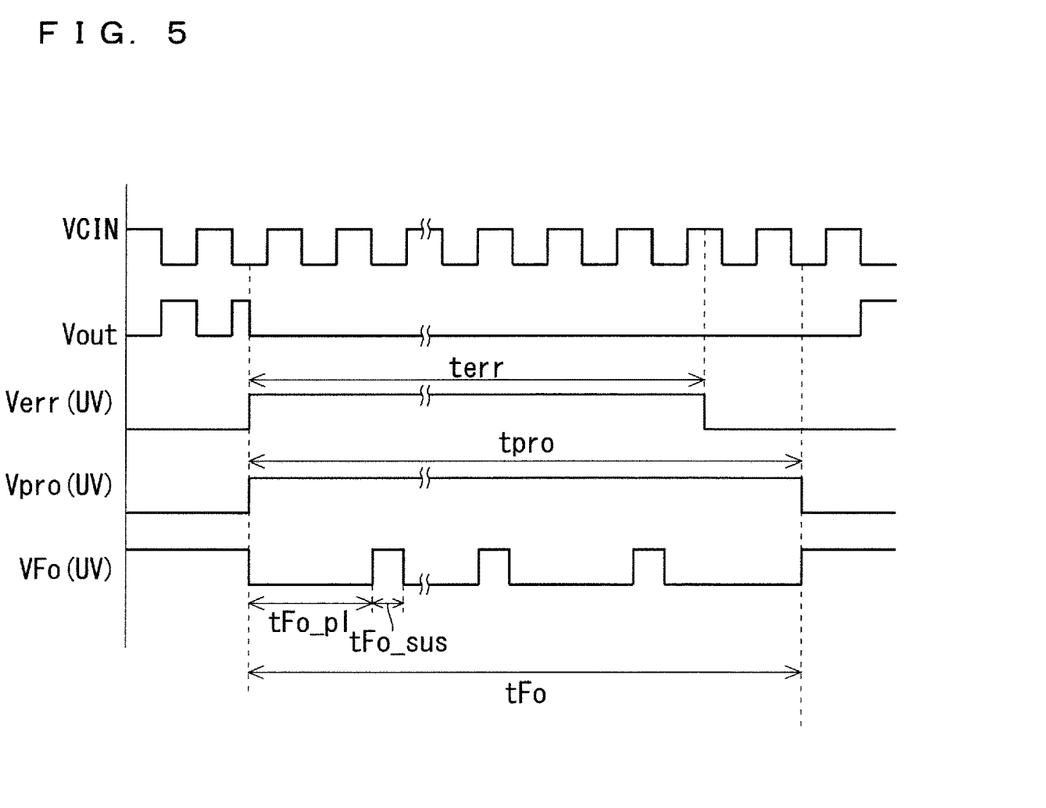
FIG. 5 is a diagram showing the alarm signal according to the first preferred embodiment in the case of terr>tpro (min)

FIG. 5 shows the alarm signal VFo of the first preferred embodiment in the case of terr>tpro (min). The error period terr, the protection operation period tpro, and the alarm signal output period tFo at this time are set so as to satisfy terr≤tpro=tFo.

Further, the identification pulse generating circuit 24 sets tFo, tFo_pl, and tFo_sus so as to satisfy Expression (2). Here, "n" is a natural number, which is a different value for each type of the error.

[Expression 2]

$$n \times tFo\_pl + (n-1) \times tFo\_sus = tFo \quad (2)$$

That is, the alarm signal VFo is outputted so as to satisfy Expression (3).

[Expression 3]

$$terr \leq n \times tFo\_pl + (n-1) \times tFo\_sus \quad (3)$$

In this manner, the identification pulse generating circuit 24 sets the alarm signal output period tFo to a length in accordance with the type of the abnormality. When the alarm signal VFo ends, the protection operation determining circuit 23 determines that the operation of the protection function of the IGBT 11 has ended, and turns off the protection operation signal Vpro.

Next, a function of the protection operation signal Vpro will be described. The protection operation signal Vpro is a signal for preventing the alarm signal VFo corresponding to a second abnormality from being outputted if the identification pulse generating circuit 24 acquires the error signal Verr corresponding to the second abnormality in a period when the identification pulse generating circuit 24 is outputting the alarm signal VFo corresponding to the first abnormality.

Figure 6:
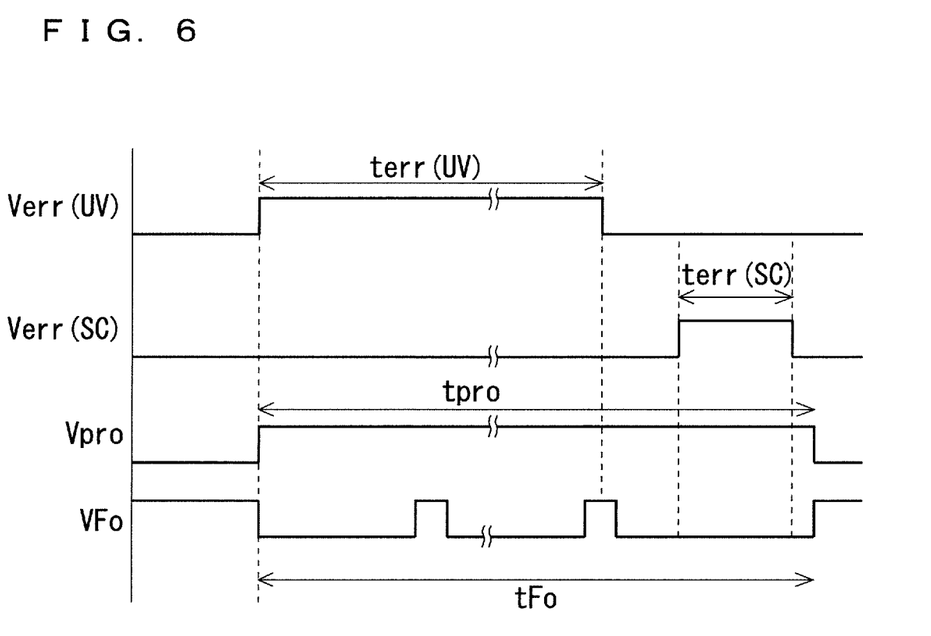
FIG. 6 is a diagram showing an error signal Verr, a protection operation signal Vpro, and an alarm signal VFo when an abnormality occurs in a control power supply voltage and then, an abnormality occurs in a current.

FIG. 6 shows the error signal Verr, the protection operation signal Vpro, and the alarm signal VFo when an abnormality occurs in the control power supply voltage, and then, an abnormality occurs in the current. First, when an abnormality occurs in the control power supply voltage, an error signal Verr(UV) is turned on, and at the same time, the protection operation signal Vpro and the alarm signal VFo are turned on.

While the error signal Verr(UV) turns off when the error period terr(UV) passes, the protection operation signal Vpro and the alarm signal VFo are still in the ON state. At this time, when an abnormality occurs in the current, an error signal Verr(SC) is turned on. However, because the protection operation signal Vpro is on, the identification pulse generating circuit 24 ignores Verr(SC) and continues to output the alarm signal VFo for the abnormality of the control power supply voltage. That is, the identification pulse generating circuit 24 does not output the alarm signal VFo corresponding to the error signal Verr(SC).

The driving device 1 for the semiconductor element according to the first preferred embodiment includes the plurality of detection circuits 21 that detect different types of abnormalities of the IGBT 11, which is a semiconductor element, the logic circuit 22 that generates the error signal Verr when at least one of the detection circuits 21 detects an abnormality, the identification pulse generating circuit 24 and the MOSFET 25, which are the alarm signal generating circuit that receives the error signal Verr and generates the alarm signal VFo made of one or a plurality of pulses, the alarm signal having a different pulse width for each of the detection circuits 21 that has detected the abnormality, and the protection operation determining circuit 23 that determines whether or not the protection function of the IGBT 11 is operating, based on the error signal Verr and the alarm signal VFo, and shuts off the input of the drive signal to the IGBT 11 when it is determined that the protection function is operating. According to the driving device 1, it is possible to detect an abnormality of the IGBT 11 from the detection circuits 21. In addition, since the alarm signal VFo has a pulse width in accordance with the type of the abnormality, it is possible to discriminate the type of the abnormality, based on the pulse width. Further, since the protection operation determining circuit 23 can determine that the abnormality of the IGBT 11 has been eliminated by the end of the alarm signal VFo, the protection operation determining circuit 23 can promptly resume the input of the drive signal to the IGBT 11 after the abnormality elimination. Further, since an alarm cancellation signal generating circuit is unnecessary, it is possible to downsize the driving device 1.

B. Second Preferred Embodiment

Figure 7:
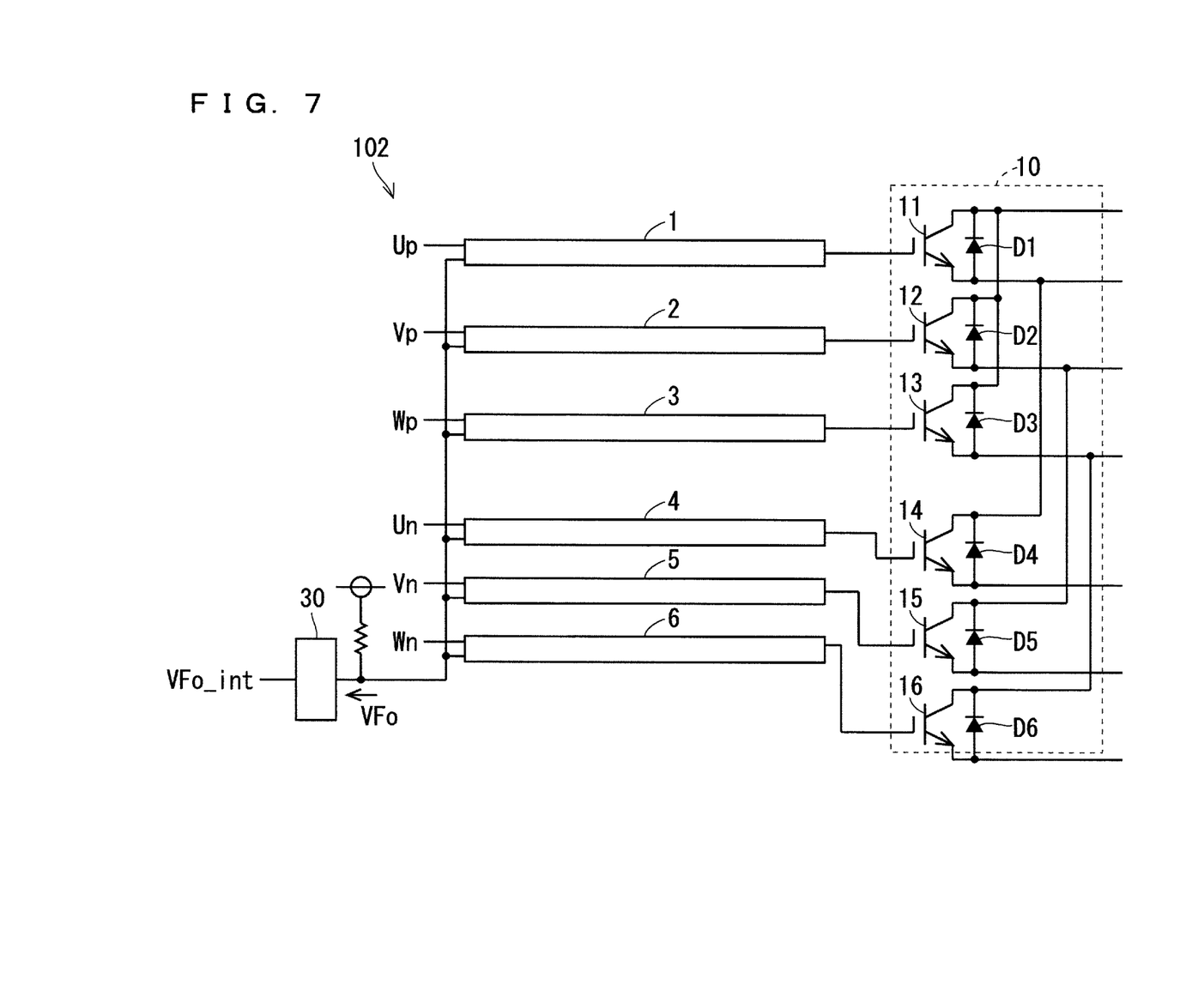
FIG. 7 is a diagram showing a schematic configuration of a main part of a semiconductor device according to a second preferred embodiment.

FIG. 7 is a diagram showing a schematic configuration of a main part of a semiconductor device 102 according to a second preferred embodiment. In addition to the configuration of the semiconductor device 101 according to the first preferred embodiment, the semiconductor device 102 includes a low-pass filter 30 that demodulates the alarm signals VFo outputted from the driving devices 1 to 6.

Figure 8:
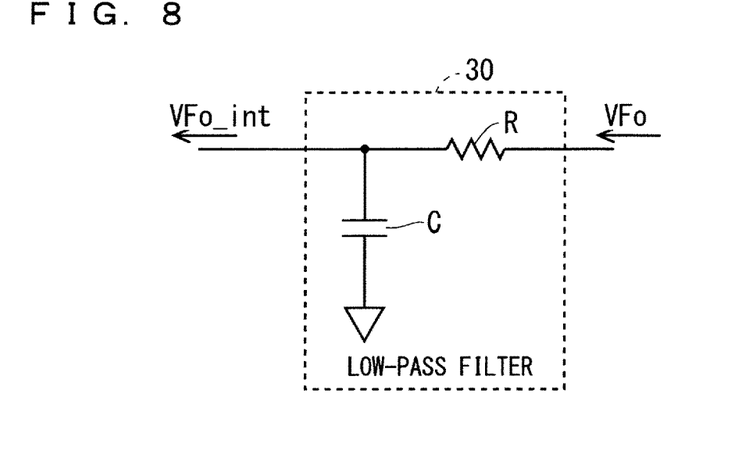
FIG. 8 is a diagram showing a low-pass filter.

FIG. 8 shows a configuration of the low-pass filter 30. The low-pass filter 30 is configured of a resistor R and a capacitor C. The low-pass filter 30 acquires the alarm signal VFo and obtains an analog alarm signal VFo_int in accordance with a duty ratio of the alarm signal VFo. It is possible to identify the type of an abnormality from a voltage value of the analog alarm signal VFo_int.

Figure 9:
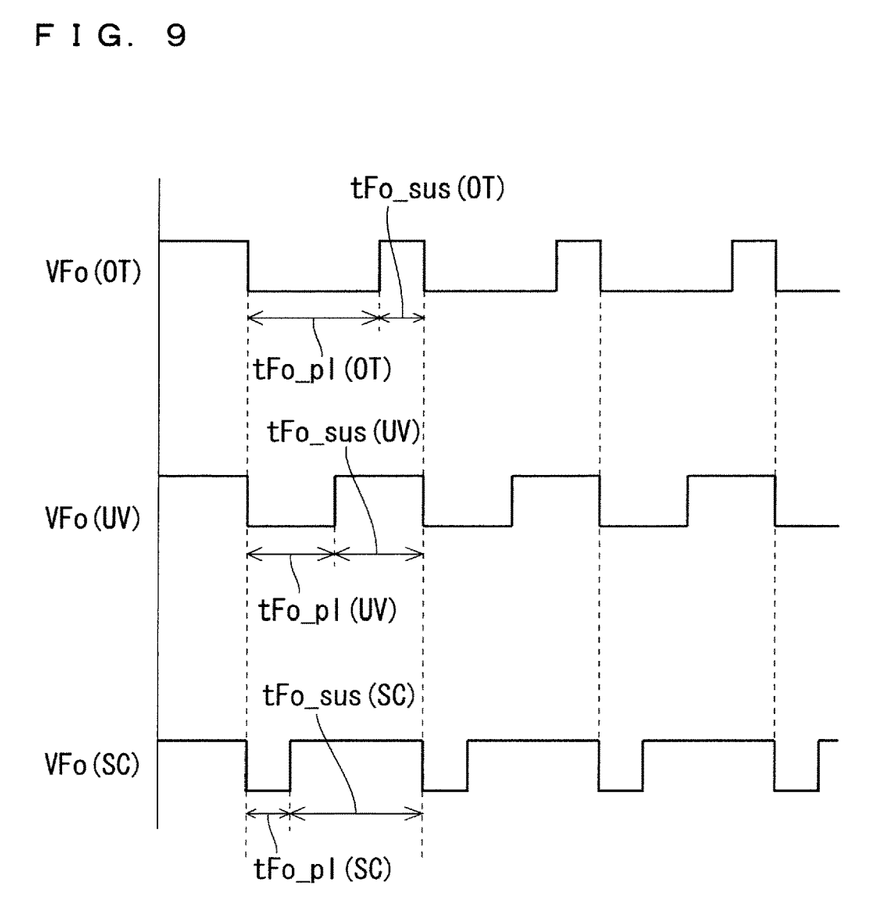
FIG. 9 is a diagram showing an alarm signal according to the second preferred embodiment.

FIG. 9 shows the alarm signal VFo of the second preferred embodiment. The alarm signal VFo of the second preferred embodiment is a PWM signal having a constant frequency $f=1/\{tFo\_pl+tFo\_sus\}$ regardless of the type of the abnormality, in which only a duty ratio $D=tFo\_pl/\{tFo\_pl+tFo\_sus\}$ differs, depending on the type of the abnormality. In FIG. 9, reference signs OT, UV, and SC in parentheses each indicate the detection circuit relating to the type of the abnormality. For example, VFo(OT) indicates an alarm signal due to abnormality detection of the temperature detecting circuit OT.

Figure 10:
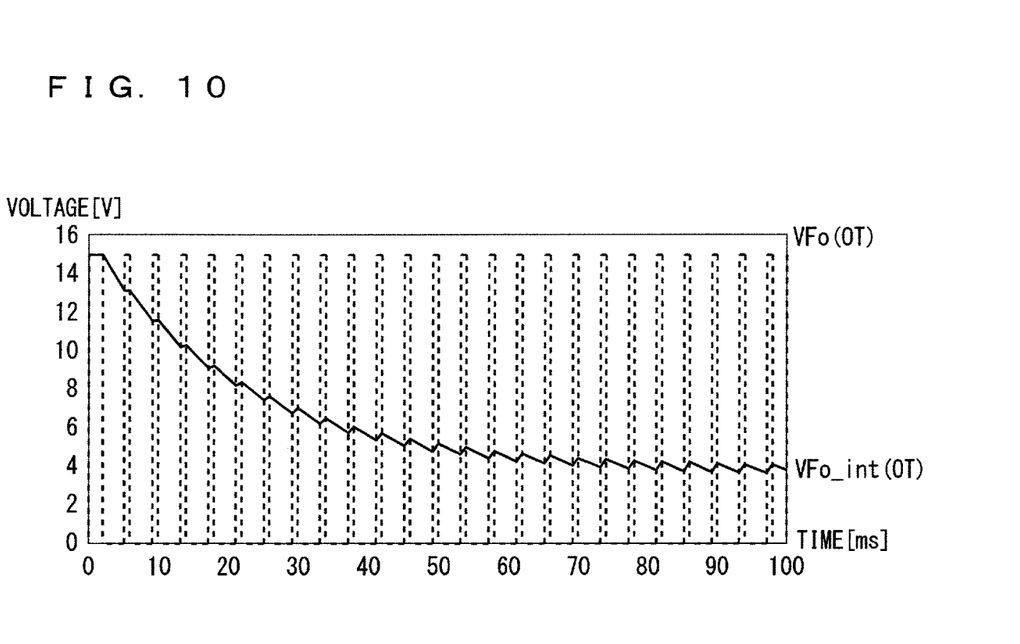
FIG. 10 is a diagram showing a calculation result of the analog alarm signal with respect to the alarm signal relating to an abnormality of the control power supply voltage.
Figure 11:
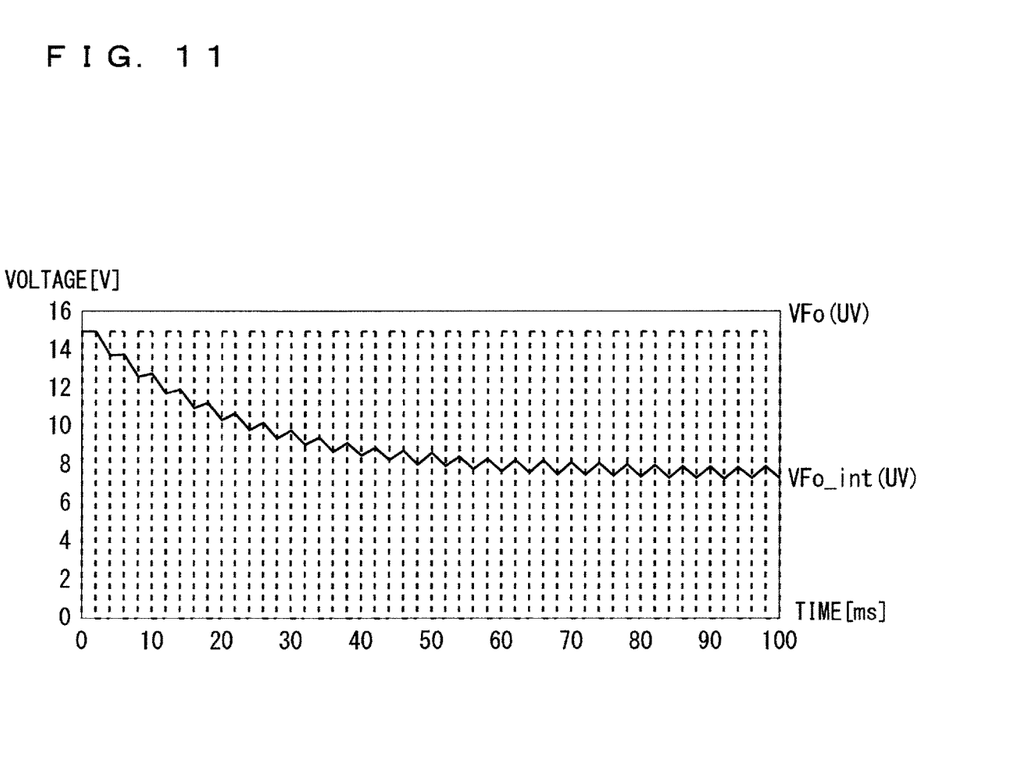
FIG. 11 is a diagram showing a calculation result of an analog alarm signal with respect to an alarm signal relating to a temperature abnormality.
Figure 12:
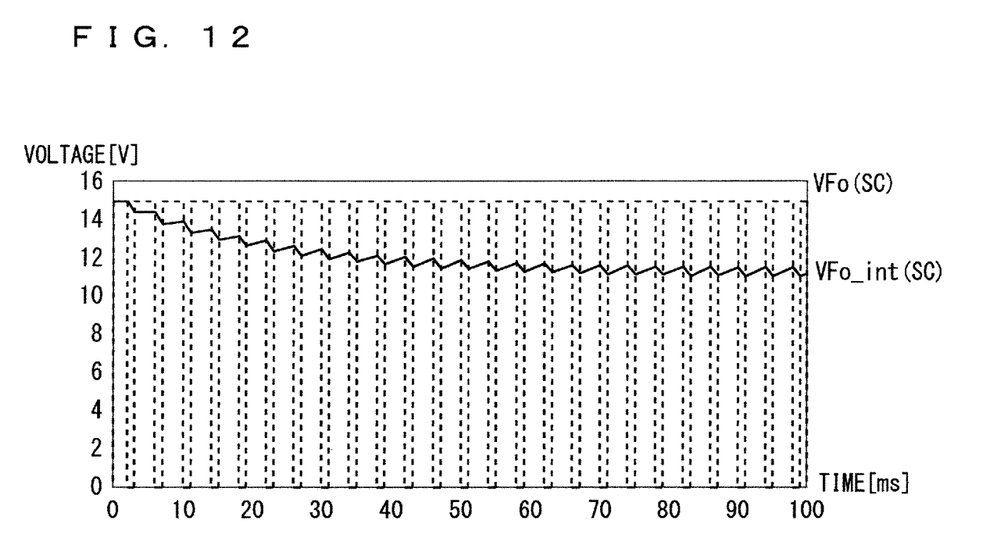
FIG. 12 is a diagram showing a calculation result of an analog alarm signal with respect to an alarm signal relating to a current abnormality.

FIGS. 10 to 12 each show a calculation result of the analog alarm signal VFo_int with respect to the alarm signal VFo. FIG. 10 shows an analog alarm signal VFo_int(OT) with respect to the alarm signal VFo(OT) relating to an abnormality of the control power supply voltage, FIG. 11 shows an analog alarm signal VFo_int(UV) with respect to the alarm signal VFo(UV) relating to a temperature abnormality, and FIG. 12 shows an analog alarm signal VFo_int (SC) with respect to an alarm signal VFo(SC) relating to a current abnormality. Also, in the low-pass filter 30, the resistor R=100 kΩ, the capacitor C=220 nF, and a filter cutoff frequency fc=1/(2πRC)=14.47 Hz. Furthermore, regardless of the type of the abnormality, a period T of the alarm signal VFo is set to 4 ms and a frequency f is set to 250 Hz, and tFo_pl(OT)=3 ms, tFo_pl(UV)=2 ms, and tFo_pl(SC)=1 ms are established. An abnormality occurred at a time 2 ms, and the alarm signal VFo is starting to be outputted. In this case, if the duty ratios of the alarm signals VFo(OT), VFo(UV) and VFo(SC) are expressed by D(OT), D(UV), and D(SC), respectively, D(OT)=0.75, D(UV)=0.5, and D(SC)=0.25.

According to FIGS. 10 to 12, a voltage value of the analog alarm signal VFo_int at a time 100 ms is VFo_int(OT)= 3.79V, VFo_int(UV)=7.24V, VFo_int(SC)=11.21V, which are voltage values in accordance with the duty ratios D(OT), D(UV), and D(SC), respectively. The analog alarm signal VFo_int includes a residual ripple, but a magnitude thereof depends on the cutoff frequency fc of the low-pass filter 30 and the frequency f of the alarm signal VFo.

According to the driving device for a semiconductor element according to the second preferred embodiment, the frequency f of the alarm signal VFo is constant regardless of the detection circuit that has detected the abnormality, and the duty ratio D of the alarm signal VFo differs in accordance with the detection circuit that has detected the abnormality. Therefore, the values of R and L in the low-pass filter 30 used for demodulating the alarm signal VFo can be fixed, so that a demodulation circuit can be easily designed.

C. Third Preferred Embodiment

Figure 13:
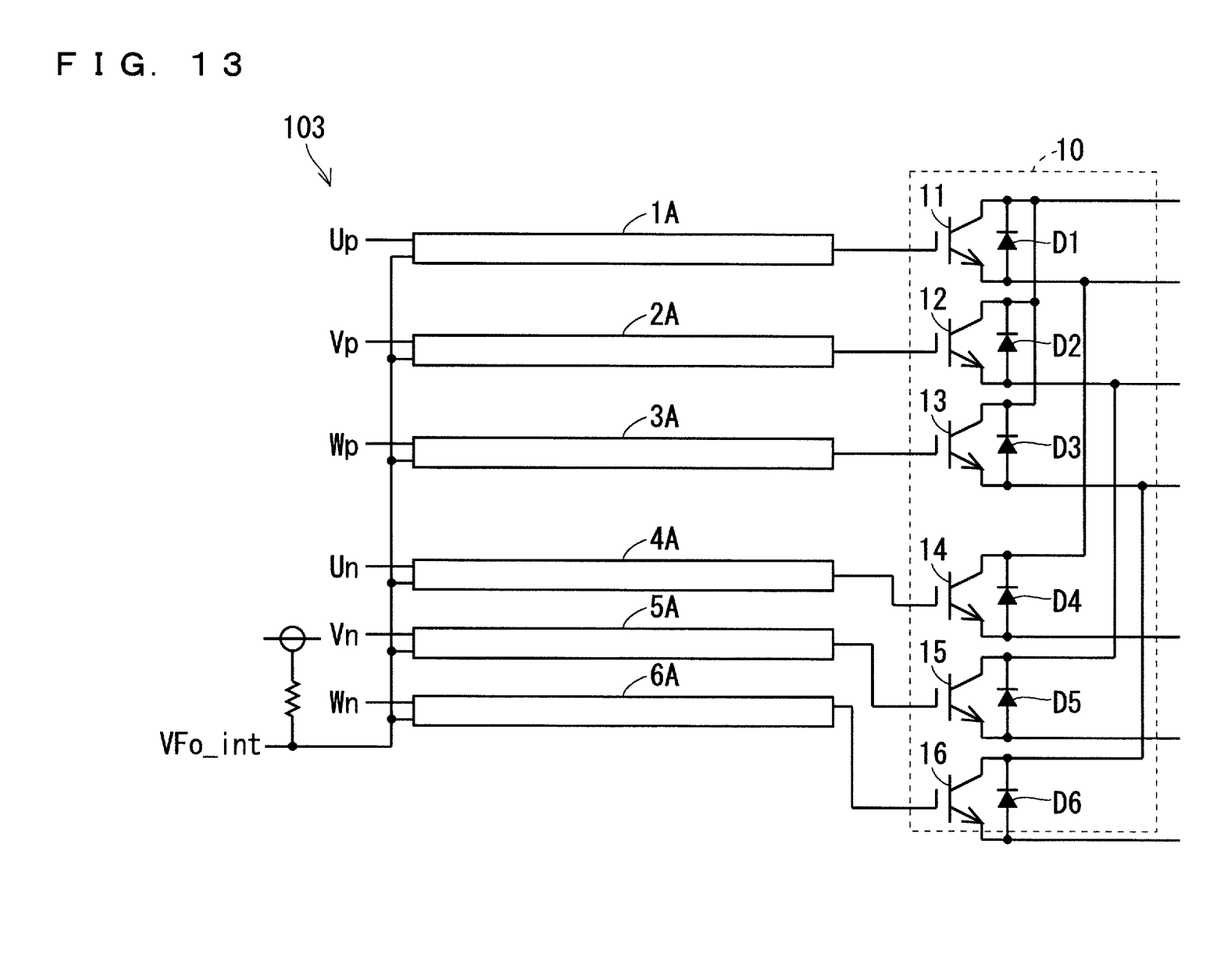
FIG. 13 is a diagram showing a schematic configuration of a main part of a semiconductor device according to a third preferred embodiment.

FIG. 13 is a diagram showing a schematic configuration of a main part of a semiconductor device 103 according to a third preferred embodiment. The semiconductor device 103 includes driving devices 1A to 6A in place of the driving devices 1 to 6 of the semiconductor device 101 according to the first preferred embodiment, and other configurations of the semiconductor device 103 are similar to those of the semiconductor device 101.

Figure 14:
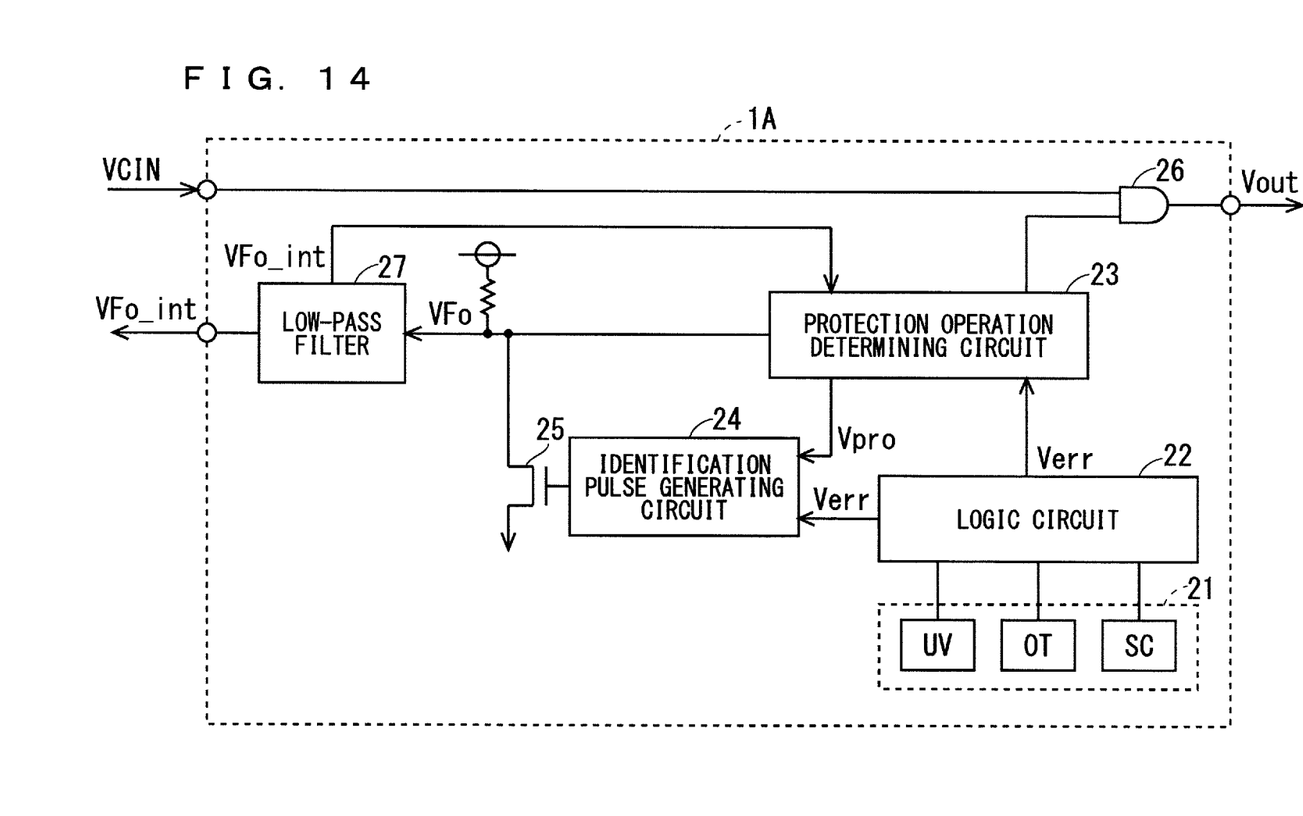
FIG. 14 is a diagram showing a schematic configuration of a driving device according to a third preferred embodiment.

FIG. 14 shows a schematic configuration of the driving device 1A. Since configurations of the other driving devices 2A to 6A are similar to that of the driving device 1, description of these configurations will be omitted. The driving device 1A includes a low-pass filter 27 in addition to the configuration of the driving device 1 according to the first preferred embodiment. The low-pass filter 27 integrates the alarm signal VFo outputted from the source of the MOSFET 25, outputs an obtained analog alarm signal VFo_int to an outside of the driving device 1A, and outputs the analog alarm signal VFo_int to the protection operation determining circuit 23. Based on the analog alarm signal VFo_int, the protection operation determining circuit 23 determines whether or not the protection function of the IGBT 11 is operating.

According to the driving device 1A according to the third preferred embodiment, by monitoring an average value of the analog alarm signal VFo_int outside the driving device 1A, the type of an error can be determined. Also, by monitoring the analog alarm signal VFo_int by the protection operation determining circuit 23, it can be determined whether or not the protection function of the IGBT 11 is operating.

Figure 15:
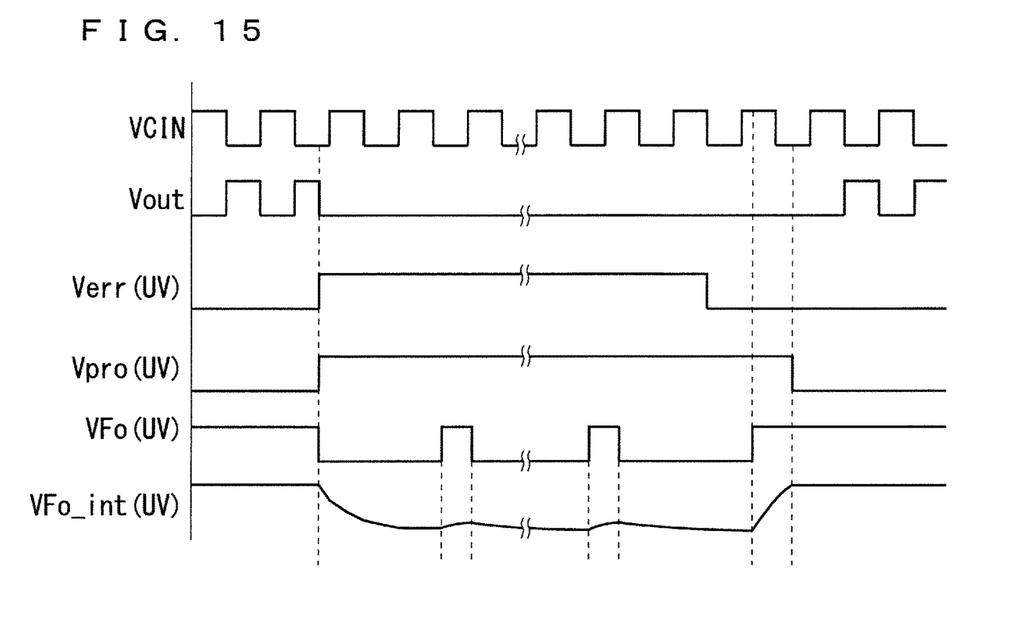
FIG. 15 is a diagram showing an analog alarm signal according to the third preferred embodiment.

FIG. 15 shows the analog alarm signal VFo_int outputted from the driving device 1A. Based on the alarm signal VFo and the analog alarm signal VFo_int, the protection operation determining circuit 23 determines whether or not the protection function of the IGBT 11 is operating. Specifically, the protection operation determining circuit 23 determines that the protection function of the IGBT 11 has started at timing when the alarm signal VFo switches from OFF to ON, and turns on the protection operation signal Vpro. Then, at timing when the analog alarm signal VFo_int returns to a constant value, the protection operation determining circuit 23 determines that the protection function of the IGBT 11 has ended, and turns off the protection operation signal Vpro.

The driving device 1A for the semiconductor element according to the third preferred embodiment includes the low-pass filter 27 that converts the alarm signal VFo to the analog signal. From the error signal Verr and the analog alarm signal VFo_int, which is the alarm signal converted to the analog signal, the protection operation determining circuit 23 determines whether or not the protection function of the IGBT 11 is operating. In this way, including the low-pass filter 27 in the driving device 1A makes it easy to design a demodulation circuit outside the driving device 1A.

D. Fourth Preferred Embodiment

Figure 16:
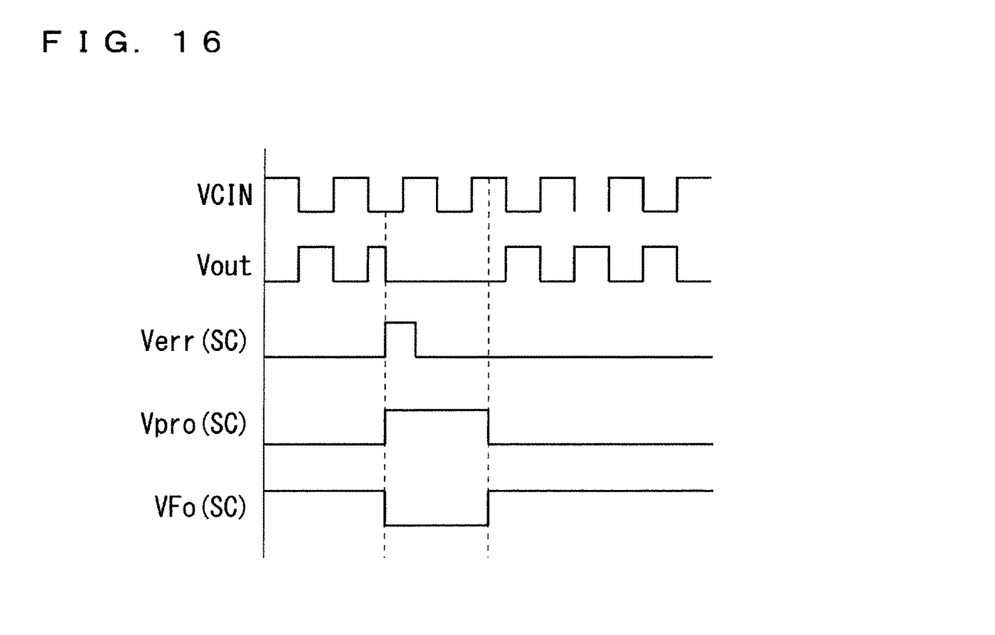
FIG. 16 is a diagram showing an alarm signal relating to a current abnormality according to a fourth preferred embodiment.

A configuration of a driving device of a fourth preferred embodiment is similar to those of the driving devices of the first to third preferred embodiments. However, in the fourth preferred embodiment, the alarm signal VFo(SC) relating to the current abnormality is configured of a single pulse as shown in FIG. 16. The alarm signals VFo(UV) and VFo(OT) relating to the other types of abnormalities are configured of a plurality of pulses as in the first to third preferred embodiments.

The current detecting circuit SC detects an abnormality when an overcurrent equal to or larger than a preset current value flows in the semiconductor element, and performs protection operation for the semiconductor element. At this time, a period when the overcurrent flows in the semiconductor element is at most several μs to several tens μs, and if it exceeds this, there is a possibility that the semiconductor element itself is damaged. On the other hand, there is no upper limit for abnormality periods relating to the control power supply voltage and the temperature of the semiconductor element, and they may be several ms or several tens ms. Therefore, by configuring only the alarm signal VFo (SC) corresponding to the current detecting circuit SC of a single pulse, the alarm signal output period tFo can be set shorter.

In the driving device for the semiconductor element according to the fourth preferred embodiment, the detection circuits 21 include the current detecting circuit SC that detects a current abnormality of the semiconductor element. Upon receiving the error signal Verr(SC) generated when the current detecting circuit SC detects an abnormality, the alarm signal generating circuit generates the alarm signal VFo(SC) configured of one pulse, and upon receiving the error signal Verr generated when the detection circuit other than the current detecting circuit SC detects an abnormality, the alarm signal generating circuit generates the alarm signal VFo configured of a plurality of pulses. This makes it possible to clearly distinguish the current abnormality of the semiconductor element from the other abnormality such as the control power supply voltage abnormality, the temperature abnormality or the like.

E. Fifth Preferred Embodiment

Figure 17:
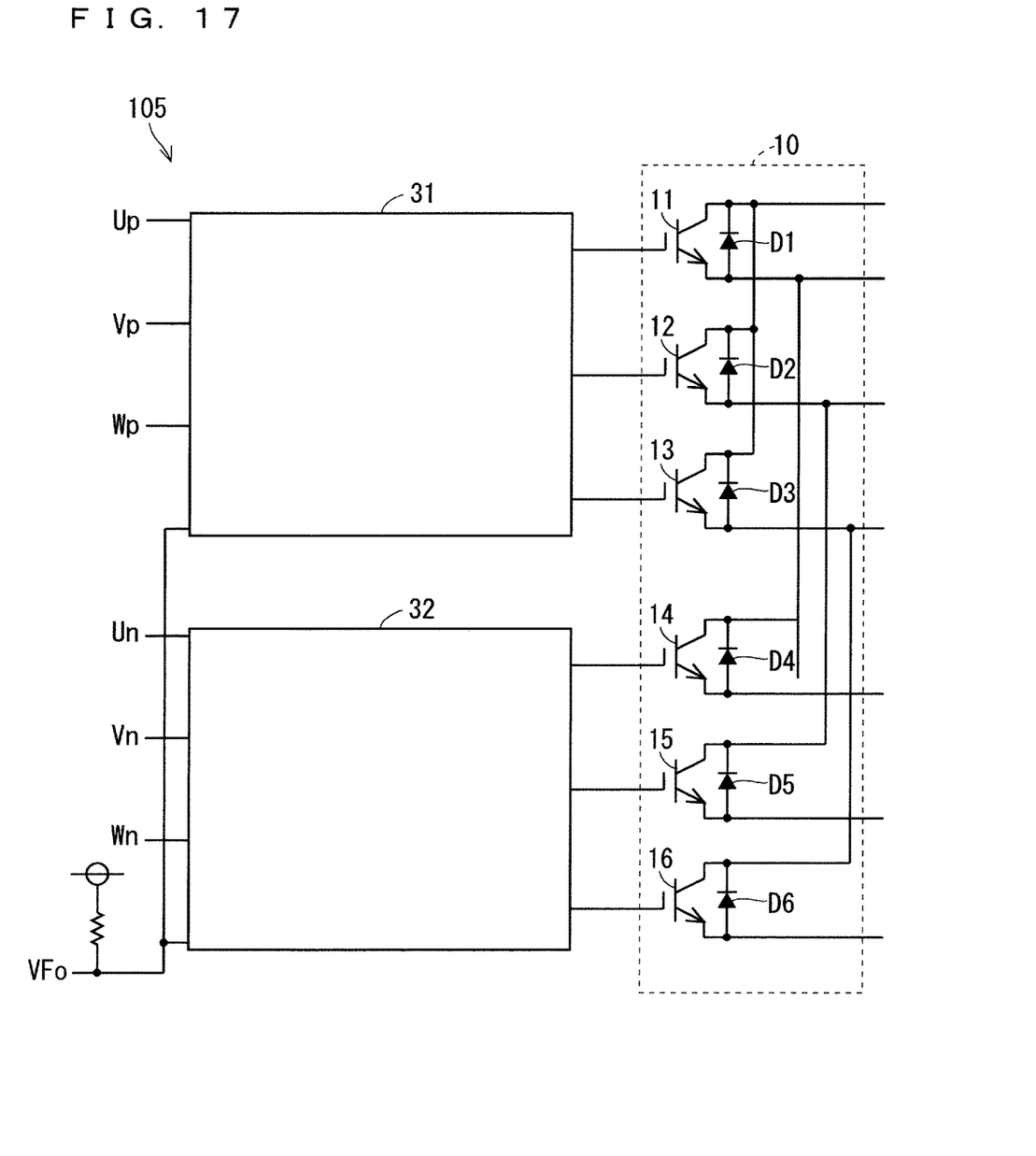
FIG. 17 is a diagram showing a schematic configuration of a main part of a semiconductor device according to a fifth preferred embodiment.

FIG. 17 is a diagram showing a schematic configuration of a main part of a semiconductor device 105 according to a fifth preferred embodiment. The semiconductor device 105 includes the inverter 10, a driving device 31 that drives the IGBTs 11, 12, 13 of the upper arms of U, V, W phases, and a driving device 32 that drives the IGBTs 14, 15, 16 of the lower arms of the U, V, W phases.

Figure 18:
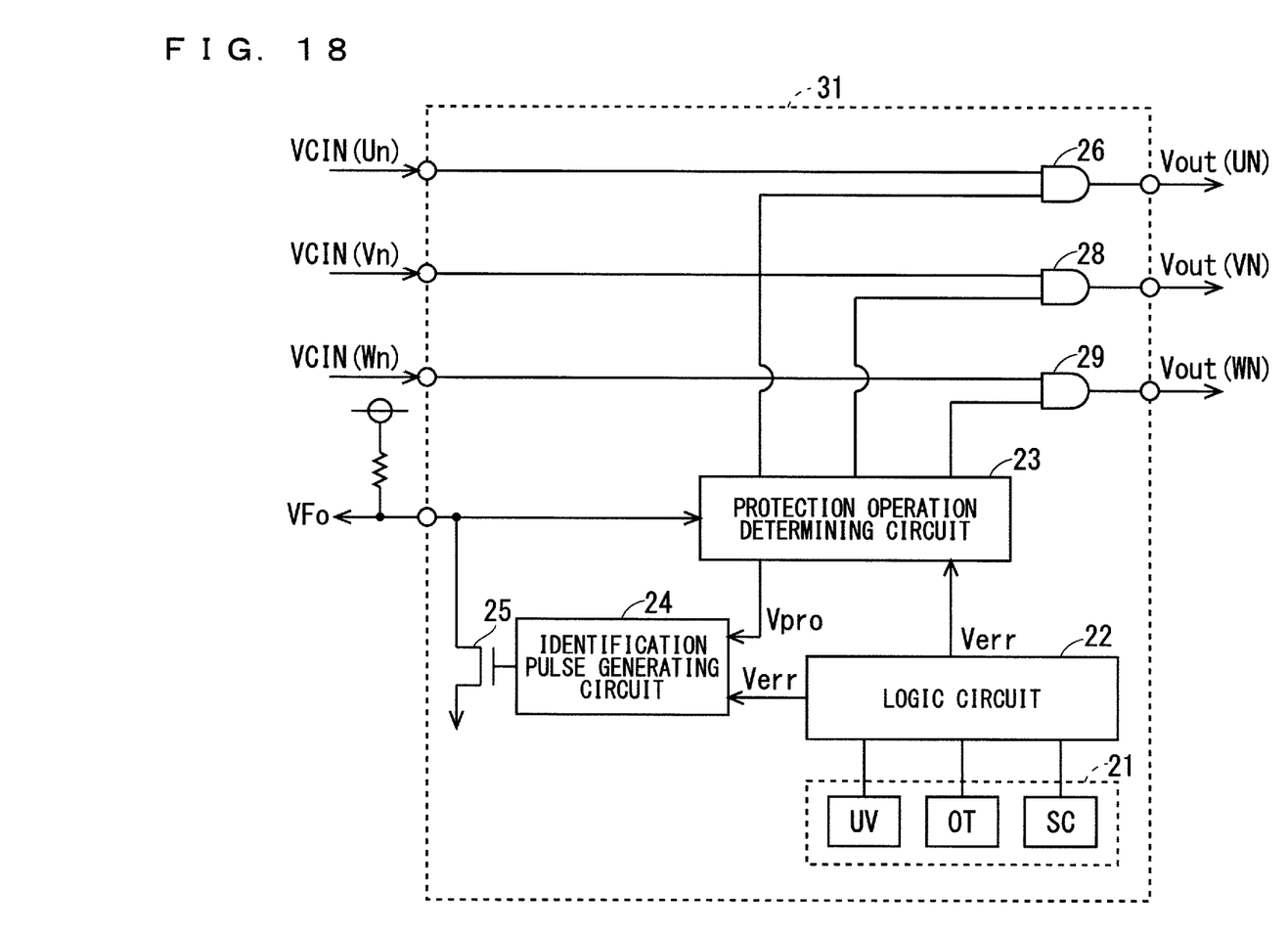
FIG. 18 is a diagram showing a schematic configuration of a driving device according to a fifth preferred embodiment.

FIG. 18 is a diagram showing a schematic configuration of the driving device 31. Since a configuration of the driving device 32 is similar to that of the driving device 31, description thereof will be omitted. The driving device 31 includes the detection circuits 21, the logic circuit 22, the protection operation determining circuit 23, the identification pulse generating circuit 24, the MOSFET 25, and AND gates 26, 28, 29. That is, the driving device 31 results from adding the AND gates 28, 29 to the configuration of the driving device 1 of the first preferred embodiment. The AND gate 28 has a V-phase control signal VCIN(Vn) and the signal from the protection operation determining circuit 23 inputted, and outputs a V-phase gate control signal Vout (VN). The AND gate 29 has a W-phase control signal VCIN(Wn) and the signal from the protection operation determining circuit 23 inputted, and outputs a W-phase gate control signal Vout(WN).

The driving device 31 according to the fifth preferred embodiment is shared by the IGBTs 11, 12, 13, which are semiconductor elements of a plurality of phases. Specifically, in the driving device 31, the detection circuits 21, the logic circuit 22, the protection operation determining circuit 23, the identification pulse generating circuit 24, and the MOSFET 25 are shared in the U, V, and W phases. As a result, the circuits can be downsized. The configuration of the present preferred embodiment is effective when a driving circuit of a plurality of phases is configured of an HVIC (High Voltage Integrated Circuit) or an LVIC (Low Voltage Integrated Circuit), particularly in a transfer mold type IPM or the like.

In the present invention, within the scope of the invention, each of the preferred embodiments can be freely combined, each of the preferred embodiments can be appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A driving device for a semiconductor element comprising:
    a plurality of detection circuits that detect different types of abnormalities of the semiconductor element;
    a logic circuit that generates an error signal when at least one of the detection circuits detects an abnormality;
    an alarm signal generating circuit that receives the error signal and generates an alarm signal made of one or a plurality of pulses, the alarm signal having a different pulse width for each of the detection circuits that has detected an abnormality; and
    a protection operation determining circuit that determines whether or not a protection function of the semiconductor element is operating based on the error signal and the alarm signal, and shuts off input of a drive signal to the semiconductor element when it is determined that the protection function is operating.

2. The driving device for the semiconductor element according to claim 1, wherein
    a frequency of the alarm signal is constant regardless of the detection circuit that has detected the abnormality, and
    a duty ratio of the alarm signal differs depending on the detection circuit that has detected the abnormality.

3. The driving device for the semiconductor element according to claim 2 further comprising a low-pass filter that converts the alarm signal to an analog signal, wherein
    from the error signal and the analog signal that is converted from the alarm signal, the protection operation determining circuit determines whether or not the protection function of the semiconductor element is operating.

4. The driving device for the semiconductor element according to claim 3, wherein
    the detection circuits each include a current detecting circuit that detects a current abnormality of the semiconductor element, and
    upon receiving the error signal generated when the current detecting circuit detects an abnormality, the alarm signal generating circuit generates the alarm signal made of one pulse, and upon receiving the error signal generated when the detection circuit other than the current detecting circuit detects an abnormality, the alarm signal generating circuit generates the alarm signal made of the plurality of pulses.

5. The driving device for the semiconductor element according to claim 4, wherein the driving device is shared by semiconductor elements of a plurality of phases.

6. The driving device for the semiconductor element according to claim 3, wherein the driving device is shared by semiconductor elements of a plurality of phases.

7. The driving device for the semiconductor element according to claim 2, wherein
    the detection circuits each include a current detecting circuit that detects a current abnormality of the semiconductor element, and
    upon receiving the error signal generated when the current detecting circuit detects an abnormality, the alarm signal generating circuit generates the alarm signal made of one pulse, and upon receiving the error signal generated when the detection circuit other than the current detecting circuit detects an abnormality, the alarm signal generating circuit generates the alarm signal made of the plurality of pulses.

8. The driving device for the semiconductor element according to claim 7, wherein the driving device is shared by semiconductor elements of a plurality of phases.

9. The driving device for the semiconductor element according to claim 2, wherein the driving device is shared by semiconductor elements of a plurality of phases.

10. The driving device for the semiconductor element according to claim 1, wherein
    the detection circuits each include a current detecting circuit that detects a current abnormality of the semiconductor element, and
    upon receiving the error signal generated when the current detecting circuit detects an abnormality, the alarm signal generating circuit generates the alarm signal made of one pulse, and upon receiving the error signal generated when the detection circuit other than the current detecting circuit detects an abnormality, the alarm signal generating circuit generates the alarm signal made of the plurality of pulses.

11. The driving device for the semiconductor element according to claim 10, wherein the driving device is shared by semiconductor elements of a plurality of phases.

12. The driving device for the semiconductor element according to claim 1, wherein the driving device is shared by semiconductor elements of a plurality of phases.

* * * * *